United States Patent
Van Vliet et al.

(10) Patent No.: US 10,575,434 B2
(45) Date of Patent: Feb. 25, 2020

(54) HEAT EXCHANGER

(71) Applicant: Remeha B.V., Apeldoorn (NL)

(72) Inventors: Sebastiaan Rogier Van Vliet, Apeldoorn (NL); Bart Gerardus Dirk Van Diepen, Apeldoorn (NL)

(73) Assignee: REMEHA B.V., Apeldoorn (NL)

( * ) Notice: Subject to any disclaimer, the term of this patent is extended or adjusted under 35 U.S.C. 154(b) by 179 days.

(21) Appl. No.: 15/590,591

(22) Filed: May 9, 2017

(65) Prior Publication Data

US 2017/0332513 A1 Nov. 16, 2017

(30) Foreign Application Priority Data

May 10, 2016 (NL) ..................................... 2016755

(51) Int. Cl.
*H05K 7/20* (2006.01)
*F28D 21/00* (2006.01)
*F28D 7/14* (2006.01)
*F24H 1/43* (2006.01)
*F24H 9/02* (2006.01)
(Continued)

(52) U.S. Cl.
CPC ............. *H05K 7/202* (2013.01); *F24H 1/208* (2013.01); *F24H 1/43* (2013.01); *F24H 9/02* (2013.01); *F24H 9/20* (2013.01); *F28D 7/024* (2013.01); *F28D 7/14* (2013.01); *F28D 21/0007* (2013.01); *F28F 1/40* (2013.01); *F28F 9/013* (2013.01);
(Continued)

(58) Field of Classification Search
CPC ..... F24H 1/43; F24H 1/40; F24H 9/02; F24H 1/208; F28D 7/024; F28D 7/14; F28D 21/0007

USPC ... 165/10, 64, 67, 104.19, 104.24, 163, 164, 165/181, 183, 158; 122/15.1, 18.1, 40
See application file for complete search history.

(56) References Cited

U.S. PATENT DOCUMENTS 7,302,916 B2 * 12/2007 LeMer ....................... F24H 1/43
122/15.1
8,656,867 B2 * 2/2014 Deivasigamani ......... F24H 1/44
122/249
(Continued)

FOREIGN PATENT DOCUMENTS

CA 2752093 A1 * 9/2010 ............. F23D 14/62
CA 2786897 A1 * 8/2011 ............... F24H 1/43
(Continued)

*Primary Examiner* — Cassey D Bauer
*Assistant Examiner* — Jenna M Hopkins
(74) *Attorney, Agent, or Firm* — Birch, Stewart, Kolasch & Birch, LLP

(57) ABSTRACT

A heat exchanger assembly includes at least one coil shaped heat exchanger pipe assembly for passing through a fluid to be heated, which has an inlet, an outlet and coil windings extending concentrically around a coil axis. The heat exchanger assembly further includes a housing in which the heat exchanger pipe assembly is received, such that a flue gas transport gap extends between the heat exchanger pipe assembly and the circumferential wall. In use, hot flue gas passes the coil windings, thereby imparting the heat to the fluid present in the heat exchanger pipe assembly. The housing has a first and a second end wall which close off a first end and a second end of the circumferential wall. The housing is made of plastic and the heat exchanger pipe assembly is clamped in axial direction between the first and the second end wall of the plastic housing.

20 Claims, 10 Drawing Sheets

(51) Int. Cl.
*F28D 7/02* (2006.01)
*F28F 9/013* (2006.01)
*F24H 1/20* (2006.01)
*F28F 1/40* (2006.01)
*F24H 9/20* (2006.01)

(52) U.S. Cl.
CPC ............ *F28F 9/0131* (2013.01); *F28D 7/022* (2013.01); *F28D 2021/0024* (2013.01)

(56) References Cited

U.S. PATENT DOCUMENTS

| | | | | |
|---|---|---|---|---|
| 8,770,153 | B2* | 7/2014 | Hamada | F23N 1/022 |
| | | | | 122/15.1 |
| 2006/0123830 | A1* | 6/2006 | Dietschi | A61L 2/04 |
| | | | | 62/389 |
| 2006/0196450 | A1* | 9/2006 | Le Mer | F24H 1/43 |
| | | | | 122/18.1 |
| 2006/0219395 | A1* | 10/2006 | Le Mer | F24H 1/43 |
| | | | | 165/163 |
| 2007/0000653 | A1* | 1/2007 | Alessandrini | F24H 1/43 |
| | | | | 165/163 |
| 2007/0209606 | A1* | 9/2007 | Hamada | F24H 1/43 |
| | | | | 122/18.1 |
| 2008/0185132 | A1* | 8/2008 | Cannas | F24H 1/43 |
| | | | | 165/163 |
| 2011/0041781 | A1* | 2/2011 | Deivasigamani | F24H 1/44 |
| | | | | 122/18.1 |
| 2011/0185985 | A1* | 8/2011 | Ahmady | F24H 1/18 |
| | | | | 122/18.1 |
| 2012/0312513 | A1 | 12/2012 | Le Mer et al. | |
| 2013/0008635 | A1* | 1/2013 | Alessandrini | F24H 1/43 |
| | | | | 165/163 |
| 2013/0042823 | A1* | 2/2013 | Mirjalali | F24H 1/165 |
| | | | | 122/18.1 |
| 2014/0124181 | A1* | 5/2014 | Deivasigamani | F24H 1/44 |
| | | | | 165/163 |
| 2014/0138053 | A1* | 5/2014 | Alessandrini | F24H 1/43 |
| | | | | 165/104.14 |
| 2016/0146541 | A1* | 5/2016 | De Nardis | F28D 7/024 |
| | | | | 165/110 |

FOREIGN PATENT DOCUMENTS

| | | | | |
|---|---|---|---|---|
| DE | 10026549 | C1 * | 11/2001 | ........... F24H 9/0042 |
| DE | 10051219 | C1 * | 2/2002 | ............... F24H 1/43 |
| EP | 1746362 | A2 * | 1/2007 | ............. F24H 1/208 |
| EP | 2995880 | A1 * | 3/2016 | ............... F24H 1/43 |
| EP | 1813882 | B1 * | 8/2016 | ............. F28D 7/024 |
| FR | 2 846 075 | A1 | 4/2004 | |
| FR | 2 850 451 | A1 | 7/2004 | |
| FR | 2850451 | A1 * | 7/2004 | ............... F24H 1/43 |
| WO | WO 2004/036121 | A1 | 4/2004 | |
| WO | WO-2004036121 | A1 * | 4/2004 | ............... F24H 1/43 |
| WO | WO 2005/080900 | A2 | 9/2005 | |
| WO | WO 2007/066369 | A1 | 6/2007 | |
| WO | WO-2007066369 | A1 * | 6/2007 | ............... F24H 1/43 |
| WO | WO 2011/092332 | A1 | 6/2011 | |
| WO | WO 2012/156954 | A1 | 11/2012 | |
| WO | WO-2015140664 | A1 * | 9/2015 | ............... F24H 9/148 |
| WO | WO-2015140713 | A1 * | 9/2015 | ............... F24H 1/43 |
| WO | WO 2016/001852 | A1 | 1/2016 | |

\* cited by examiner

HEAT EXCHANGER

The invention relates to a heat exchanger for a central heating application for heating CH water and/or for sanitary water heating. The heat exchanger comprises a coil shaped water pipe assembly.

BACKGROUND

From US2006/0196450 A1 (Rocco Giannoni) a heat exchanger is known which comprises a coil shaped heat exchanger pipe assembly which is received in a housing. The objective of that publication was to be able to provide a heat exchanger whose housing is made from plastic instead of from metal, so that the heat exchanger as a whole can be made of lighter weight. As described in the publication in question, the coil shaped heat exchanger pipe assembly of the coil heat exchanger tends to expand in axial direction under the influence of the internal fluid pressure prevailing therein. The solution chosen in the publication in question is to provide a special construction which is not part of the housing, and which comprises ties, an annular bottom plate and a cover plate. The ties, the bottom plate and the cover plate are connected with one another, thereby axially clamping the coil shaped heat exchanger pipe assembly. This assembly is shown in FIG. 3 of the publication in question. The plastic housing consists of a first and a second housing part. The first housing part comprises two connection stubs for passing the two ends of the heat exchanger pipe assembly. The heat exchanger pipe assembly is placed in the first housing part. Thereupon the second housing part is connected with the first housing part and finally, with the help of a crimp connection, the cover plate is connected with an opening edge which is bounded by the plastic housing formed by the first and the second housing part. Further, to protect the plastic housing from the hot gases, in the housing a heat shield is arranged which is situated between the cylindrical surface of the plastic housing parts and the heat exchanger pipe assembly. In the cover plate there is a central opening which is closed off with a burner cover assembly. With the aid of bolt/nut connections the burner cover assembly is bolted to the cover plate, whereby the bolts are under strain of tension in axial direction. Between the burner cover assembly and the cover plate there is a seal which is compressed in axial direction by the tension prevailing in the bolts. Such a heat exchanger is marketed by Sermeta in various sizes, with the designations FHC for central heating and ISO Tankless and ISO Storage for sanitary water heating.

A similar heat exchanger is described in WO 2011/092332 A1 (Rocco Giannoni), an English-language equivalent of which is US2012/0312513 A1. The drawings are of a schematic nature, the description, however, is clear. According to paragraph [0078] the housing may be made from metal, in particular stainless steel. According to paragraph [0079], however, the housing is preferably made from plastic, in particular two plastic halves. The plane in which the two halves are joined together is not clearly and unambiguously disclosed in the description but FIG. 3 seems to suggest that the separating plane coincides with the plane defined by the line I-I in that figure. Of relevance is that paragraph [0088] discloses that when the housing is made from plastic, mechanical means are present for keeping the spiral bundles axially together and that these mechanical means are configured as described in FR 2 846 075 and FR 2 850 451. FR 2 846 075 belongs to the same family as US2006/0196450 A1 already mentioned and described above. The teaching of WO 2011/092332 A1 and US2012/0312513 A1 is therefore the same as that of US2006/0196450, namely, when the housing is made from plastic, use is to be made of a special construction which is not part of the housing, and which comprises ties, an annular bottom plate and a cover plate. The ties, the bottom plate and the cover plate are connected with one another, thereby axially clamping the coil shaped heat exchanger pipe assembly.

SUMMARY OF THE INVENTION

A drawback of this known apparatus is that the construction of ties, bottom plate and cover plate for clamping the heat exchanger pipe assembly in axial direction is costly and that the manufacture of the heat exchanger is relatively costly in view of the relatively large number of assembly operations and the crimping operation. Moreover, there is a hazard of hot flue gases escaping between the burner cover assembly and the cover plate when the nuts of the bolt and nut assemblies with which the burner cover assembly is connected to the cover plate are not properly tightened and so there is insufficient tension in the bolts.

The invention contemplates a heat exchanger assembly comprising a coil shaped heat exchanger pipe assembly with a plastic housing, where the above described disadvantages are at least partially resolved.

To this end, the invention provides a heat exchanger assembly which comprises at least one coil shaped heat exchanger pipe assembly for passing through a fluid. The heat exchanger pipe assembly has an inlet and an outlet and comprises coil windings extending concentrically around a coil axis. The heat exchanger pipe assembly on a radial inner side thereof bounds an inner space which comprises a burner chamber part. The heat exchanger assembly further comprises a housing in which the heat exchanger pipe assembly is received. The housing comprises a circumferential wall which is substantially cylindrical and which defines a housing axis which substantially coincides with the coil axis. An inner diameter of the circumferential wall is greater than an outer diameter of the heat exchanger pipe assembly. As a result, a flue gas transport gap extends between the heat exchanger pipe assembly and the circumferential wall. The housing further comprises a first end wall which closes off a first end of the circumferential wall, as well as an exhaust for flue gases. Further, the heat exchanger assembly comprises a burner cover which is detachably connected with the housing and which comprises an air/fuel mixture connection. The heat exchanger assembly furthermore comprises a burner which is connected with the burner cover. The burner extends substantially concentrically around a burner axis which substantially coincides with the housing axis and the coil axis. The burner is situated in the burner chamber part and is in fluid communication with the air/fuel mixture connection. In use, flue gases produced by the burner flow via the burner chamber part between the coil windings into the flue gas transport gap. Eventually, the flue gases then leave the housing via the exhaust. This can proceed directly from the flue gas transport gap, but in preferred embodiments the flue gas will pass the coil windings one more time or several more times before leaving the housing via the exhaust. The heat exchanger assembly is characterized in that the housing is divided in a first and a second housing part which are both made from plastic, wherein the first housing part includes the first end wall, and wherein the second housing part includes a second end wall, which second end wall closes off a second end of the circumferential wall at least partially and comprises a central burner cover opening which is closed off with the burner cover. Here, the first and/or the second housing part include the circumferential wall. Moreover, the heat exchanger pipe assembly is clamped in axial direction between the first and the second plastic end wall of the housing, while axial expansion forces exerted by the coil shaped heat exchanger pipe assembly, which occur in use as a result of an internal fluid pressure, are absorbed by the plastic first and second end walls of the housing.

Axial clamping of the coil shaped heat exchanger pipe assembly is done by the plastic housing itself. When connecting the two housing parts with each other, with that same operation the heat exchanger pipe assembly is clamped between the first and the second end wall. Consequently, no extra assembly operations are necessary for clamping the heat exchanger pipe assembly with the extra ties between an additional bottom plate and cover plate as in US'450.

Providing a metal end wall for taking up the burner cover, with the metal end wall connected to a plastic housing by a crimp connection as in US'450, is not necessary anymore either.

The heat exchanger assembly can be used for CH water heating, sanitary water heating, or for a combination of both.

As a result of the fewer number of assembly operations and the fewer number of parts, the heat exchanger according to the invention can be produced at a lower cost price.

Further elaborations of the heat exchanger assembly are described in the subclaims and will hereinafter, with reference to the figures, be further clarified.

DETAILED DESCRIPTION

Figure 1:
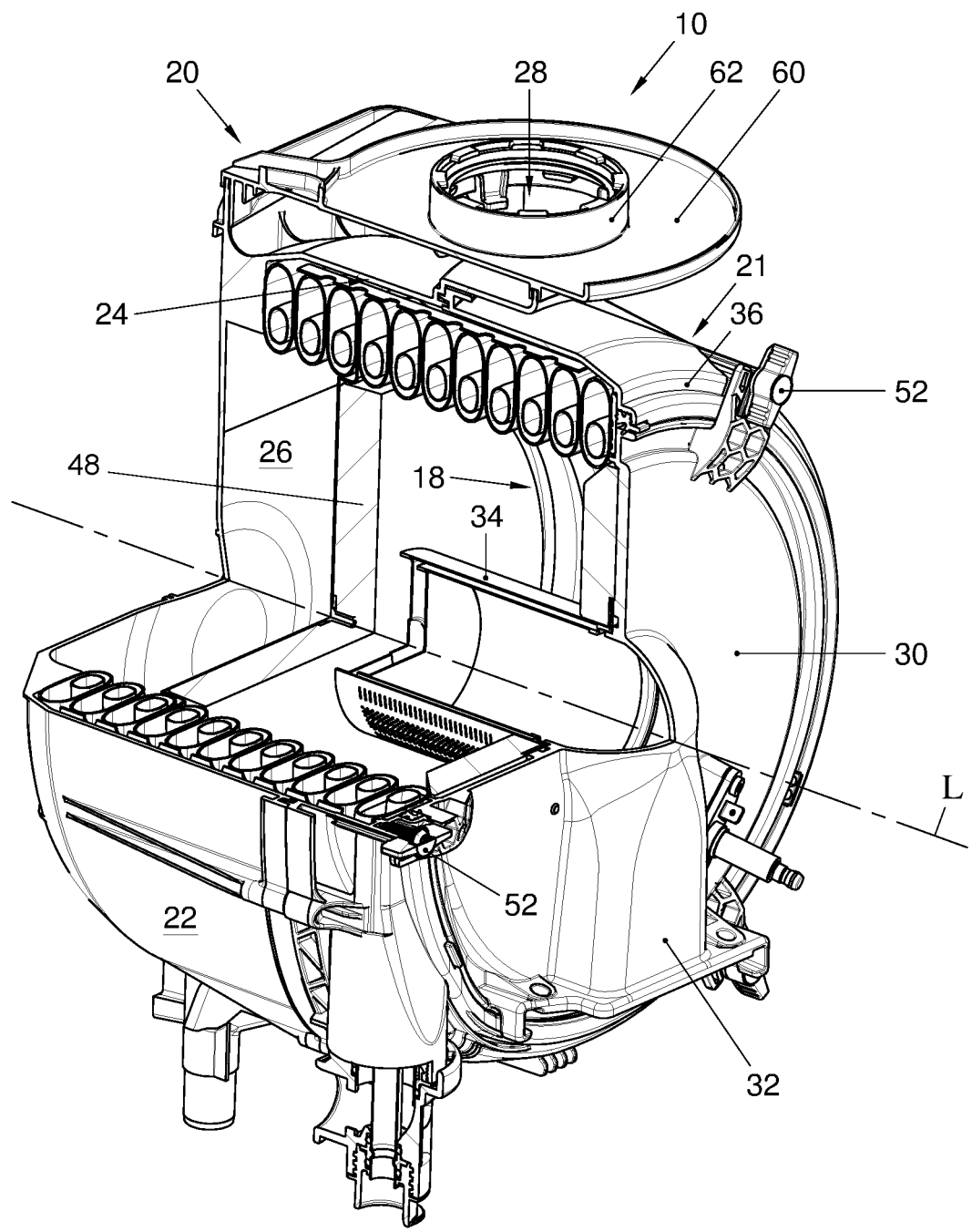
FIG. 1 shows a first perspective view of the heat exchanger in assembled condition with a quarter part of the heat exchanger cut away to provide a view of the inside.

FIGS. 1-10 show an example of a heat exchanger assembly 10 in which various embodiments, including the main aspect of the invention, are embodied. It is noted that the embodiments described hereinafter can also be applied independently of each other and that the invention is not limited to the examples shown in the figures. The reference numerals are used herein for clarification but have no limiting effect. An embodiment may also be implemented differently than represented in the example shown in the figures.

In most general terms, the invention provides a heat exchanger assembly 10 which comprises at least one coil shaped heat exchanger pipe assembly 12 (see FIG. 5) for passing through a fluid to be heated. The heat exchanger pipe assembly 12 has an inlet 14 and an outlet 16, and the heat exchanger pipe assembly 12 comprises coil windings 12' extending concentrically around a coil axis L. The heat exchanger pipe assembly 12 on a radial inner side thereof bounds an inner space which defines a burner chamber part 18. The heat exchanger assembly 10 further comprises a housing 20, 21 (see FIGS. 3 and 4) in which the heat exchanger pipe assembly 12 is received. The housing 20, 21 comprises a circumferential wall 22 which is substantially cylindrical and which defines a housing axis which substantially coincides with the coil axis L. An inner diameter of the circumferential wall 22 is greater than an outer diameter of the heat exchanger pipe assembly 12, such that a flue gas transport gap 24 extends between the heat exchanger pipe assembly 12 and the circumferential wall 22. Further, the housing comprises a first end wall 26 which closes off a first end of the circumferential wall 22. Finally, the housing comprises an exhaust 28 for flue gases. In the example shown in the figures, the exhaust 28 is bounded by a third housing part 60 which adjoins an exhaust opening present in the first housing part 20. The third housing part 60 comprises a cylindrical connecting piece 62 to which a flue gas discharge duct can be connected in a simple manner. The heat exchanger assembly 10 further comprises a burner cover 30 which is detachably connected with the housing 20, 21 and which comprises an air/fuel mixture connection 32. Connected with the burner cover 30 is a burner 34 which extends substantially concentrically around a burner axis substantially coinciding with the housing axis and the coil axis L. The burner 34 is situated in the burner chamber part 18 and is in fluid communication with the air/fuel mixture connection 32. In use, flue gases produced by the burner 34 flow via the burner chamber part 18 between the coil windings 12' into the flue gas transport gap 24. Finally, the flue gases leave the housing 20, 21 via the exhaust 28. Between their entering the flue gas transport gap 24 and their leaving the housing 20, 21 via the exhaust 28, the flue gases, in an embodiment of the heat exchanger assembly, may again pass the coil windings 12' one or more times, thus in effect being brought into heat exchanging contact with the heat exchanger pipe assembly 12 several times.

In themselves, the above-mentioned features of the heat exchanger assembly 10 are known from US2006/0196450 A1.

The heat exchanger 10 is characterized according to the invention in that the housing 20, 21 is divided into a first 20 and a second 21 housing part which are both made from plastic, wherein the first housing part 20 includes the first end wall 26 and wherein the second housing part 21 includes a second end wall 36, which second end wall 36 closes off a second end of the circumferential wall 22 at least partially and comprises a central burner cover opening which is closed off with the burner cover 30. Here, the first 20 and/or the second 21 housing part define the circumferential wall 22 and the heat exchanger pipe assembly 12 is clamped in axial direction between the first 26 and the second 36 plastic end wall of the housing 20, 21.

The advantages of such a heat exchanger assembly 10 have already been described hereinbefore in the section "summary of the invention", which is now referred to.

In an embodiment, the burner cover opening can have a diameter that is greater than an inner diameter of the heat exchanger pipe assembly 12. A radial outer area of the burner cover 30 is then in heat exchanging contact with the heat exchanger pipe assembly 12, such that in use the radial outer area of the burner cover 30 is cooled by the heat exchanger pipe assembly 12. For this, see, for example, FIG. 9.

Due to the radial outer area of the burner cover being cooled by the heat exchanger pipe assembly 12, no metal mount that is part of the housing is necessary for the burner cover 30. This is because due to the outer circumference of the burner cover 30 being relatively cool, a direct contact, possibly with interposition of a cover seal 38, between the burner cover 30 and the plastic second housing part 21 is possible.

In an embodiment, a cover seal 38 may be confined between the cooled radial outer area of the burner cover 30 and a part of the second plastic end wall 36 that bounds the central burner cover opening.

If the cover seal 38 for some reason should not seal properly, the flue gases, before reaching the gap that is sealed by the cover seal 38, first flow along the relatively cool coil shaped heat exchanger pipe assembly 12 before being able to escape from the housing 20, 21 along the cover seal 38. Therefore, no hot flue gases flow out. The flexible cover seal 38 is therefore situated in a relatively cool area. As a result, the freedom regarding the choice of the material of the cover seal 38 is relatively great, since there are no particular requirements as regards the temperature resistance of the cover seal 38.

The cover seal 38 has at least a twofold close-off function in that it closes off two potential leakage flows, namely:
  flue gas coming from the burner chamber part 18 seeking to escape to the outside is stopped;
  flue gas coming from the flue gas transport gap 24 seeking to escape to the outside is stopped.

Moreover, the cover seal 38 can further fulfill a heat insulating function which limits transfer of heat from the burner cover 30 to the plastic, second end wall 36.

In an embodiment, the heat exchanger assembly 10 may comprise a levelling ring 40 having a rising surface 42 (see FIGS. 6, 7, 9 and 10). Such a levelling ring 40 is situated between the coil winding 12' that extends closest to burner cover 30, and the burner cover 30. A side 40a of the levelling ring 40 facing the burner cover 30 forms a first contact face which abuts in heat-conducting contact against the burner cover 30. A side 40b of the levelling ring 40 facing the heat exchanger pipe assembly 12 forms a second contact face which abuts in heat conducting contact against the coil winding 12' that extends closest to the burner cover 30. The levelling ring 40 is made from heat conducting material.

As a result of the levelling ring 40, the coil shaped heat exchanger pipe assembly 12 can be manufactured in a particularly simple manner. The coil windings 12' of the heat exchanger pipe assembly 12 that are located at the axial ends do not need to be especially flattened or otherwise shaped in order for the end faces of the coil shaped heat exchanger pipe assembly 12 to extend perpendicular to the central axis L. Also the space that is present between the exit free end of the heat exchanger pipe assembly 12 that forms the outlet 16 and the coil shaped winding 12' that is closest to the burner cover 30 can be bridged with the help of the levelling ring 40. To that end, the levelling ring 40 is provided with the rising surface 42 which is clearly visible in FIG. 6. The side of the levelling ring 40 facing away from the heat exchanger pipe assembly 12 thus provides a smooth surface of flowing configuration. Being made from heat conducting material, the levelling ring 40 abutting against the burner cover 30 moreover provides a greater heating surface so that the cooling of the radial outer area of the burner cover 30 proceeds optimally and throughout the circumference. As a result of the cooled radial outer area of the burner cover, the cover seal 38 between the burner cover 30 and the opening edge in the second end wall 36 of the housing 20, 21 can be made from a material that does not need to be particularly heat resistant. Such a cover seal 38 can therefore be of relatively inexpensive design and moreover is less exposed to temperature fluctuations, which is favorable to the useful life of the cover seal 38. Moreover, due to the presence of the levelling ring 40, the burner cover opening in the second end wall 36 can have a relatively large diameter, since the annular second end wall 36 can engage the radial outer area of the levelling ring 40 and via that levelling ring 40 transfer the axial clamping force to the heat exchanger pipe assembly 12. Even when the coil windings 12' have a relatively strongly rounded cross section, as is visible in FIGS. 9 and 10, the inner diameter of the burner cover opening in the second end wall 36 can be relatively large without an effective clamping of the heat exchanger pipe assembly 12 being lost, since the axial clamping force transfer from the second end wall 36 can proceed in an effective manner via the levelling ring 40. A large inner diameter of the burner cover opening in the second end wall 36 is favorable because a relatively large radial outer area of the burner cover 30 is then in direct heat exchanging contact with the levelling ring 40. As a result, the radial outer area of the burner cover can be effectively cooled, which is of relevance to limiting as much as possible the heat loading of the cover seal 38 and of the second housing part 21 by the relatively warm burner cover 30.

In an embodiment, of which an example is shown in the figures, the cover seal 38 may be located on the side 40a of the levelling ring 40 facing away from the heat exchanger pipe assembly 12. See in particular FIGS. 8, 9 and 10. Due to this cover seal 38 in this embodiment abutting against a relatively smooth surface of flowing configuration, there too a sealing is provided in a relatively simple manner. Thus, a third leakage flow of flue gases is stopped, namely, flue gas coming from the burner chamber part 18 that is seeking to escape to the flue gas transport gap 24. The smooth surface of flowing configuration moreover provides support to the cover seal 38 throughout the circumference thereof, so that it remains in place properly.

In an embodiment, of which an example is shown in the figures, the burner cover 30, at the location of the area where the levelling ring 40 abuts against the burner cover 30, may be provided with a relief whose shape corresponds to the shape of levelling ring 40 with the rising surface 42. The relief in the burner cover 30 is most clearly seen in FIG. 2 and is designated there with arrow R.

Due to the burner cover 30 being provided with a relief, the axial dimension of the heat exchanger assembly 10, that is, the depth of the heat exchanger viewed in the direction of the axis L, can be kept relatively small because the burner cover 30 only needs to have an elevation adjacent the outlet 16. The remainder of the burner cover 30 can substantially extend adjacent the coil winding 12' that is closest to the burner cover 30. A small axial dimension of the heat exchanger assembly 10 is of great relevance in connection with the overall dimensions that are necessary for the heat exchanger assembly 10 regarding installation.

Figure 9:
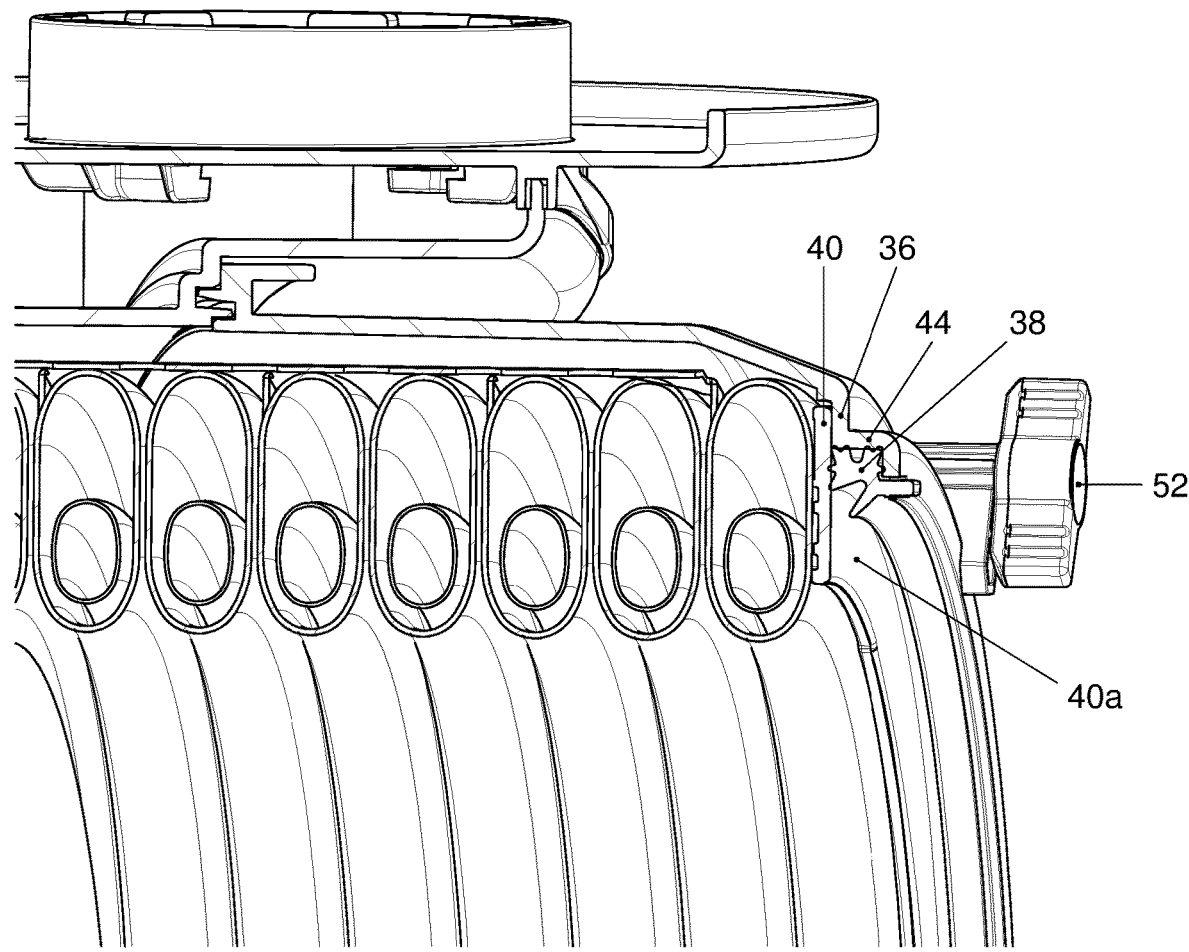
FIG. 9 shows a cross-sectional view of a part of the heat exchanger after placement of the second housing part.
Figure 10:
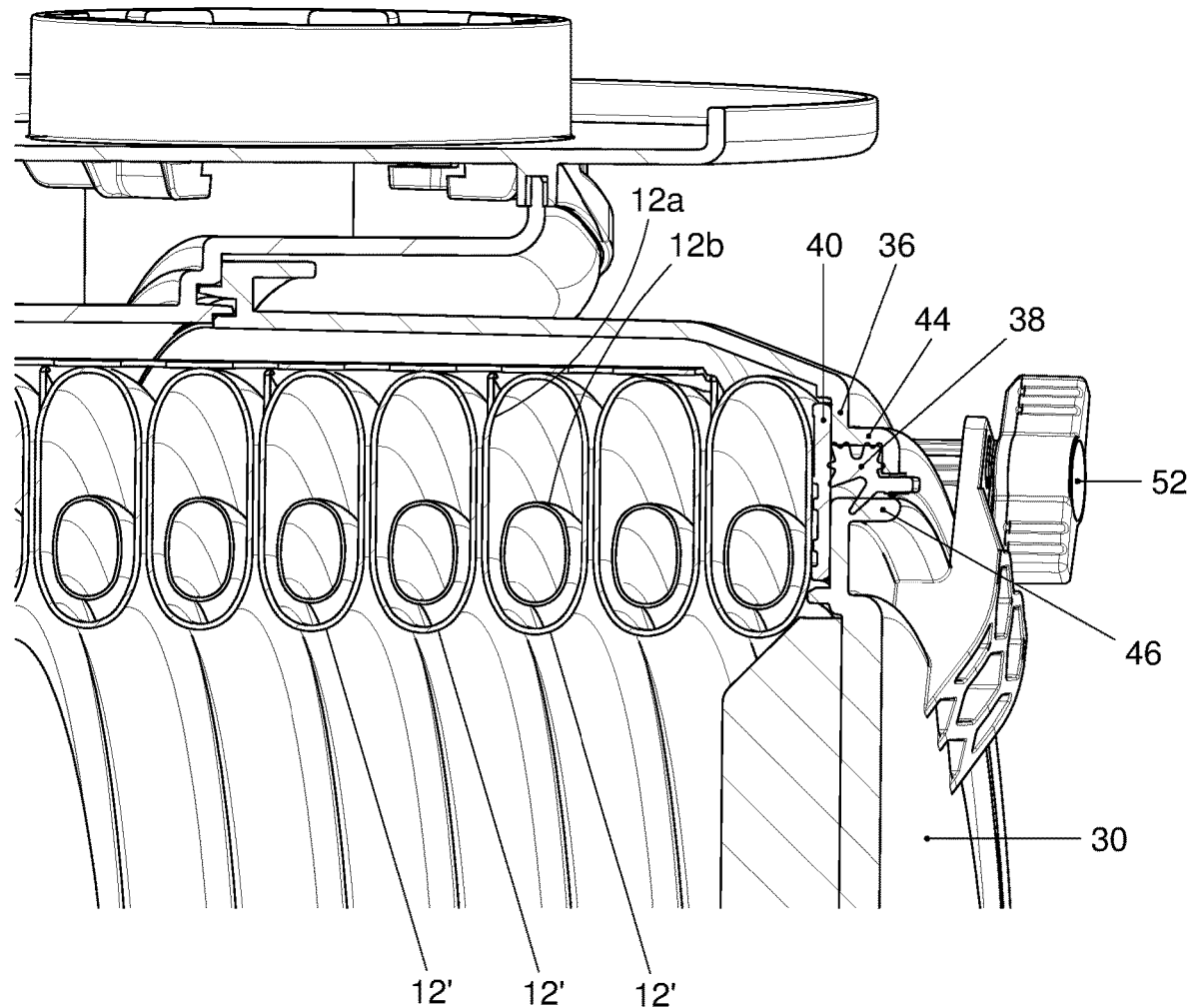
FIG. 10 shows a similar cross-sectional view to FIG. 9 after placement of the burner cover.

In an embodiment, of which an example is visible in FIGS. 9 and 10, the cover seal 38 is clamped between a cylindrical wall part 44 of the second end wall 36, extending parallel to the central axis, and a cylindrical wall part 46 of the burner cover 30, extending parallel to the central axis. As a result of such a radial clamping, a relative displacement of the burner cover 30 with respect to the housing 20, 21 in the direction of the central axis L has no influence on the sealing action of the cover seal 38. This in contrast to what is known from US2006/0196450 A1 in which the seal is clamped in axial direction. The sealing action of the radially clamped cover seal 38 is independent of the clamping force between burner cover 30 and housing 20, 21. The close-off action of the seal is therefore determined exclusively by the shape of the two cylindrical wall parts 44, 46 and not anymore by the amount of the tension of the fastening means with the help of which the burner cover 30 is connected with the housing 20, 21. Even when the fastening means are insufficiently tightened, the sealing is therefore not adversely affected. As a result, the tensioning means can be of simple design, for example using a snap connection that requires only a quarter turn rotation of a tensioning knob 52. Such a tensioning knob 52 may for instance be provided with a run-on cam which upon rotation of the tensioning knob 52 through 90 degrees brings the tensioning knob 52 from a released condition into a tightened condition. Such a manner of mounting the burner cover 30 on the housing 20, 21 is quick and reliable because the position of the tensioning knobs 52 indicates whether the fastening is tightened.

Figure 2:
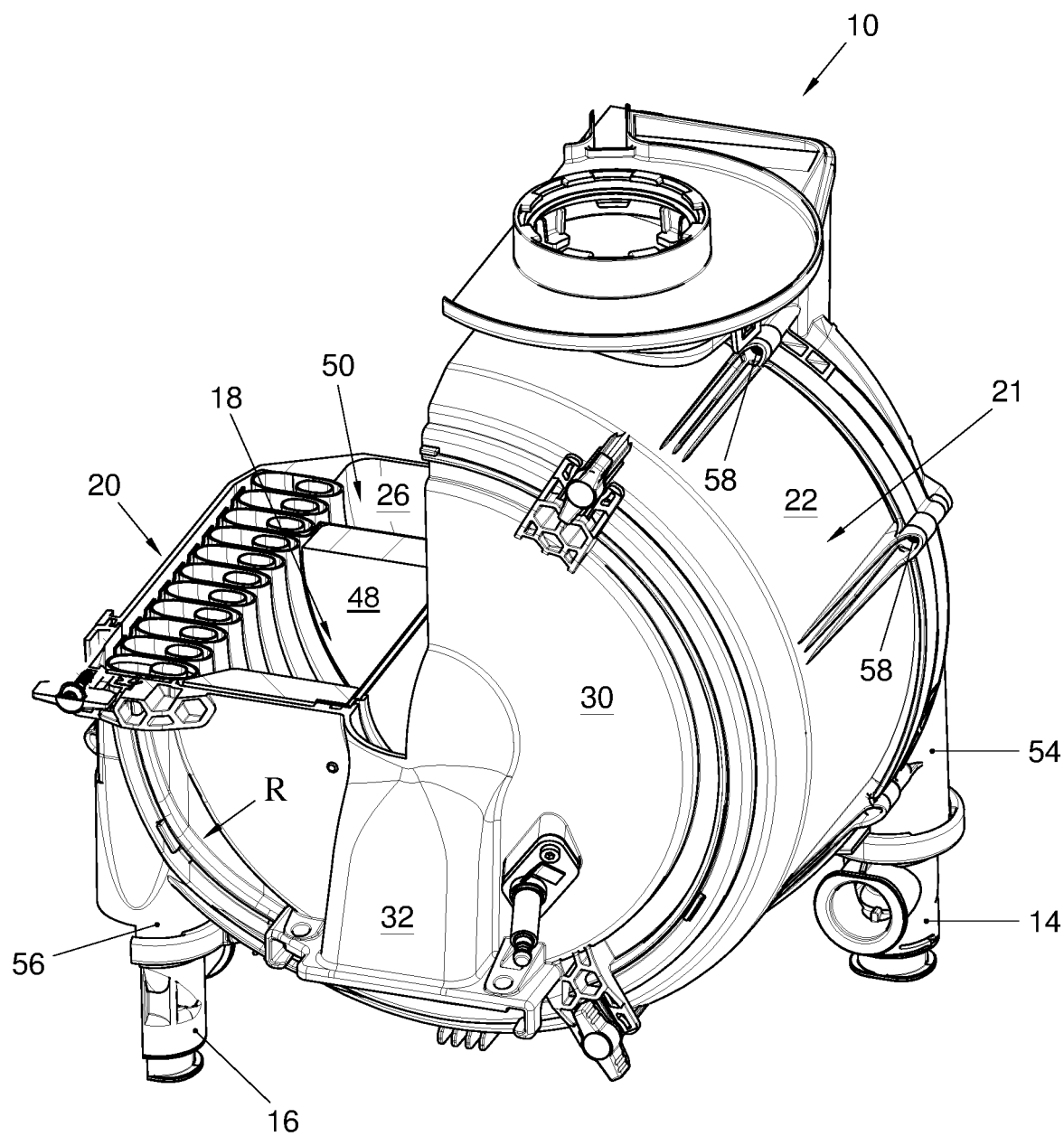
FIG. 2 shows a second perspective view of the heat exchanger in assembled condition with a quarter part of the heat exchanger cut away to provide a view of the inside.
Figure 3:
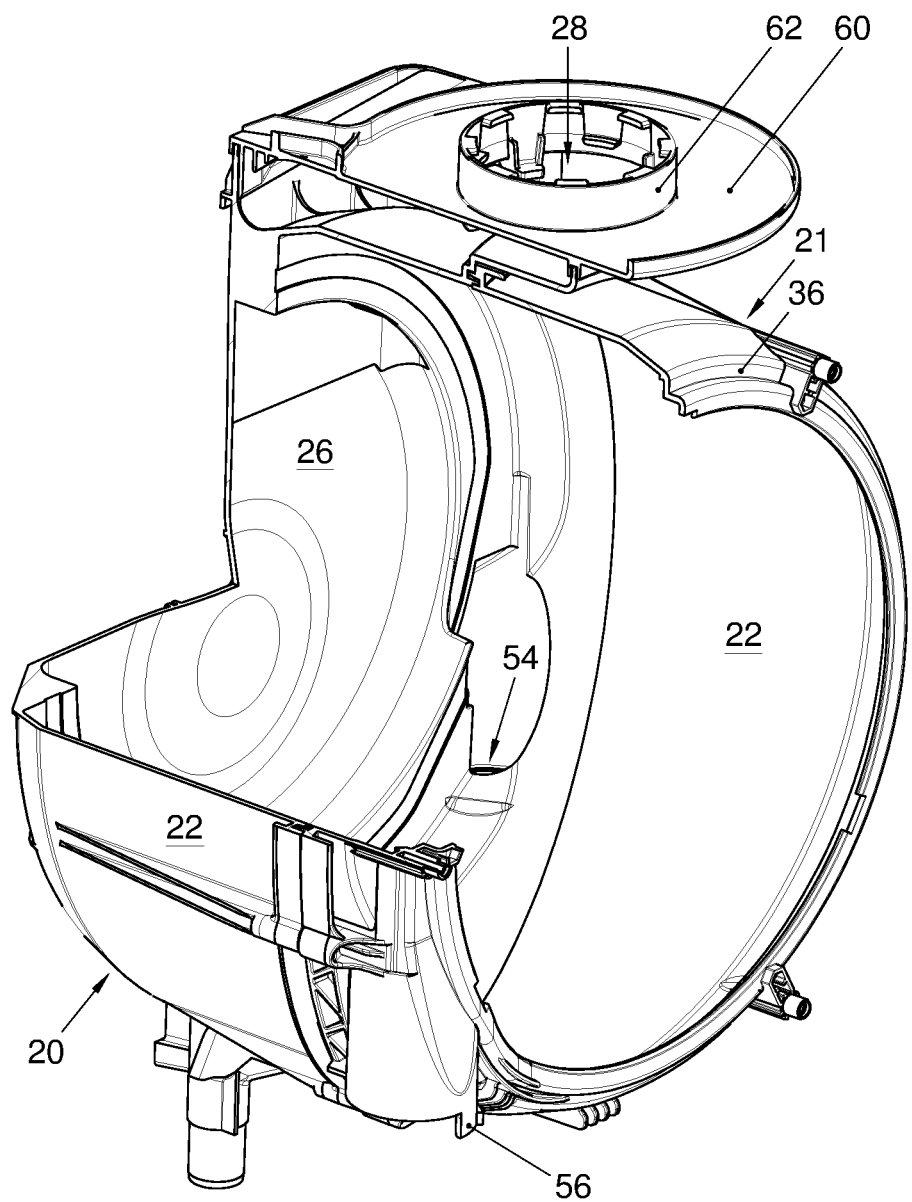
FIG. 3 shows a perspective view of an example of the housing.
Figure 4:
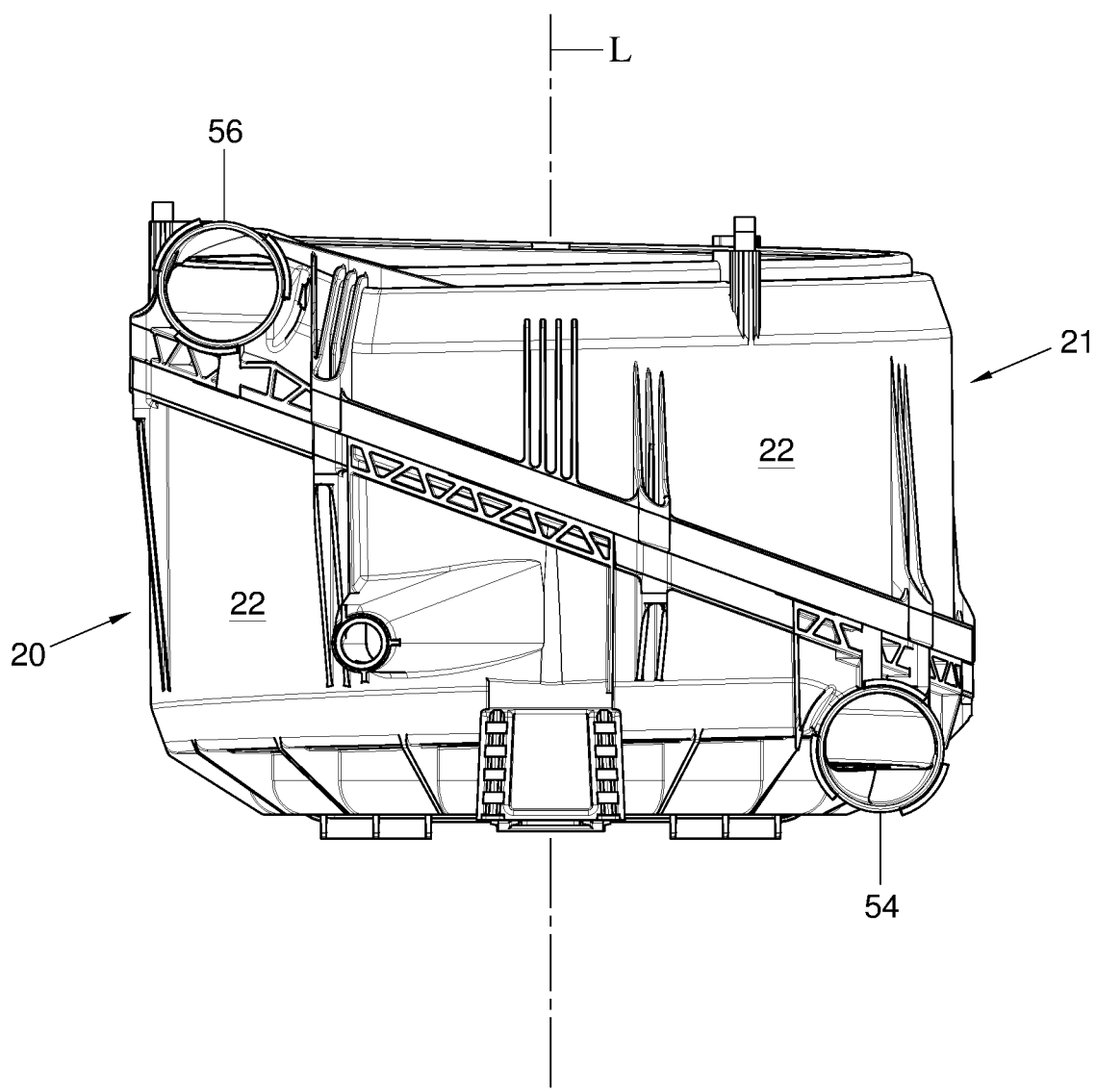
FIG. 4 shows a second perspective view of the housing represented in FIG. 3.
Figure 5:
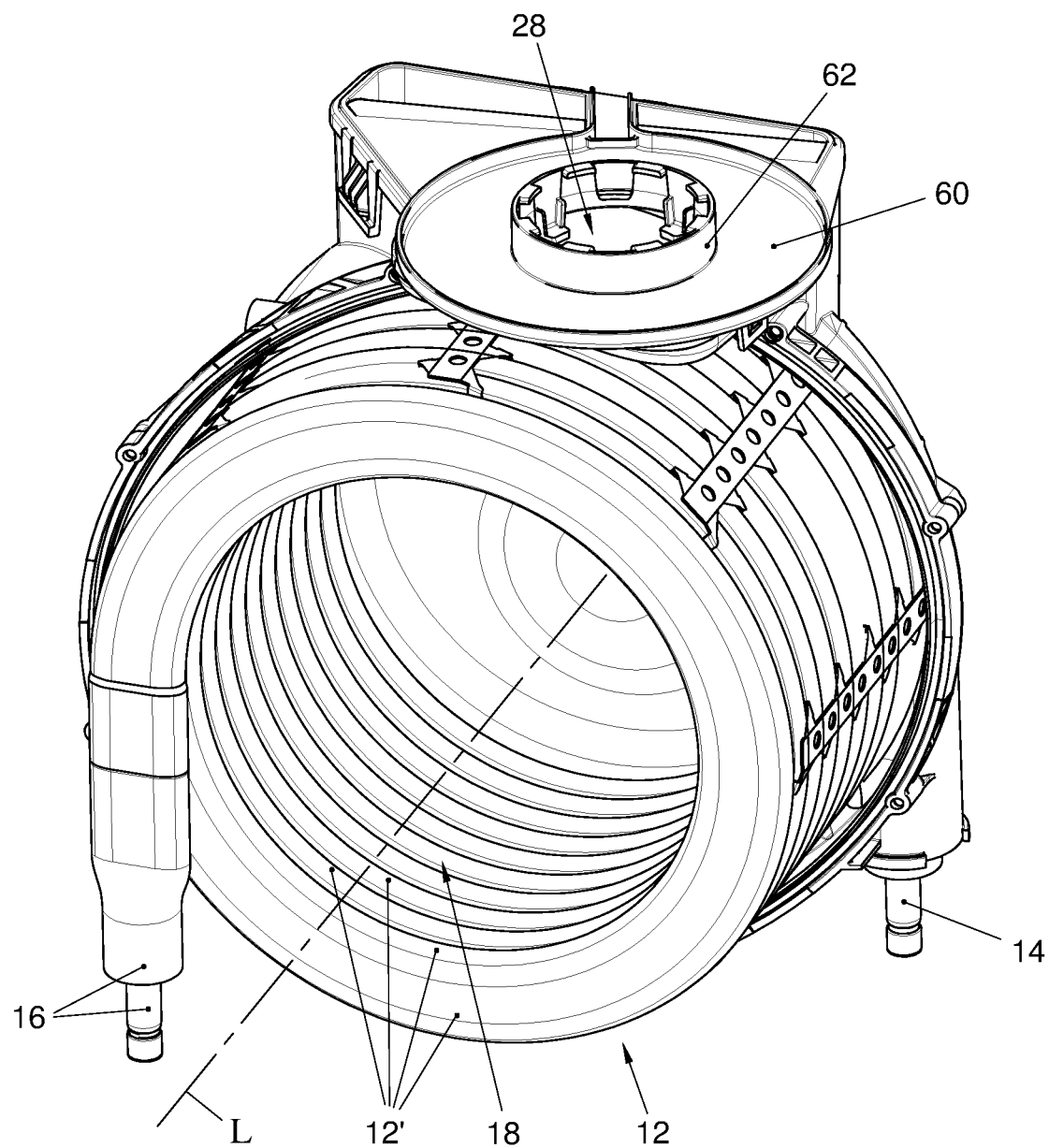
FIG. 5 shows a perspective view of the first housing part with a heat exchanger pipe assembly placed therein.
Figure 6:
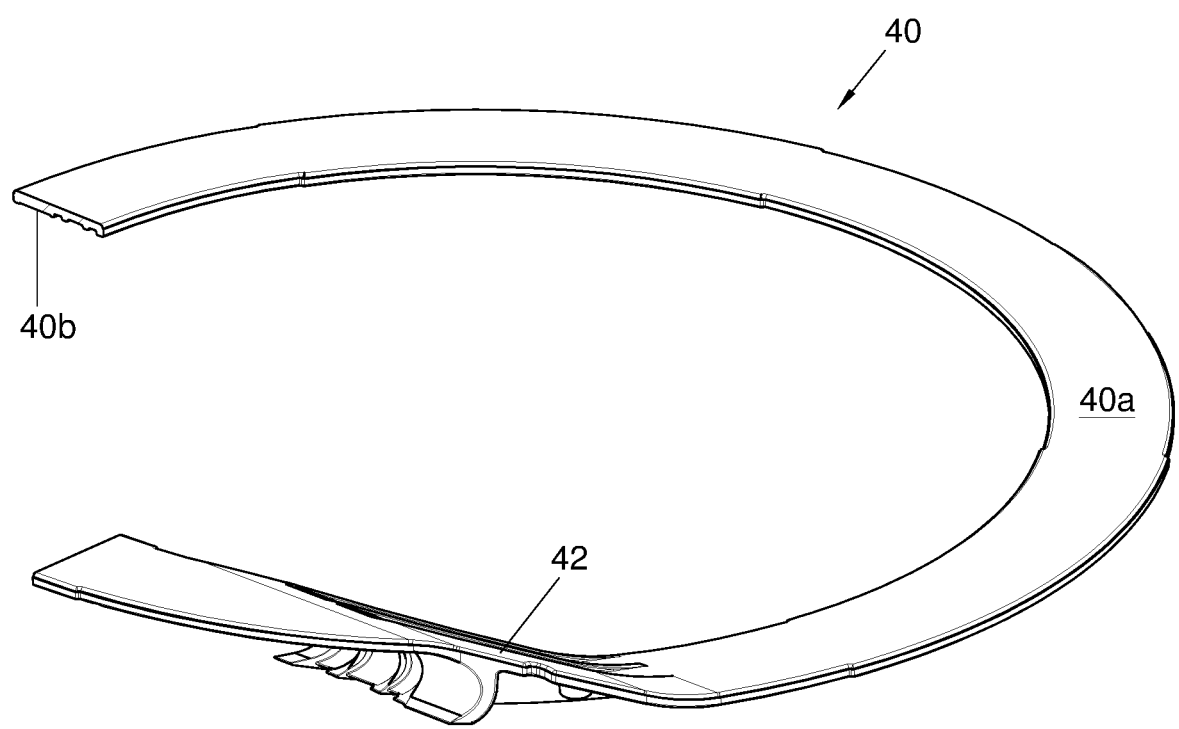
FIG. 6 shows an example of a levelling ring.
Figure 7:
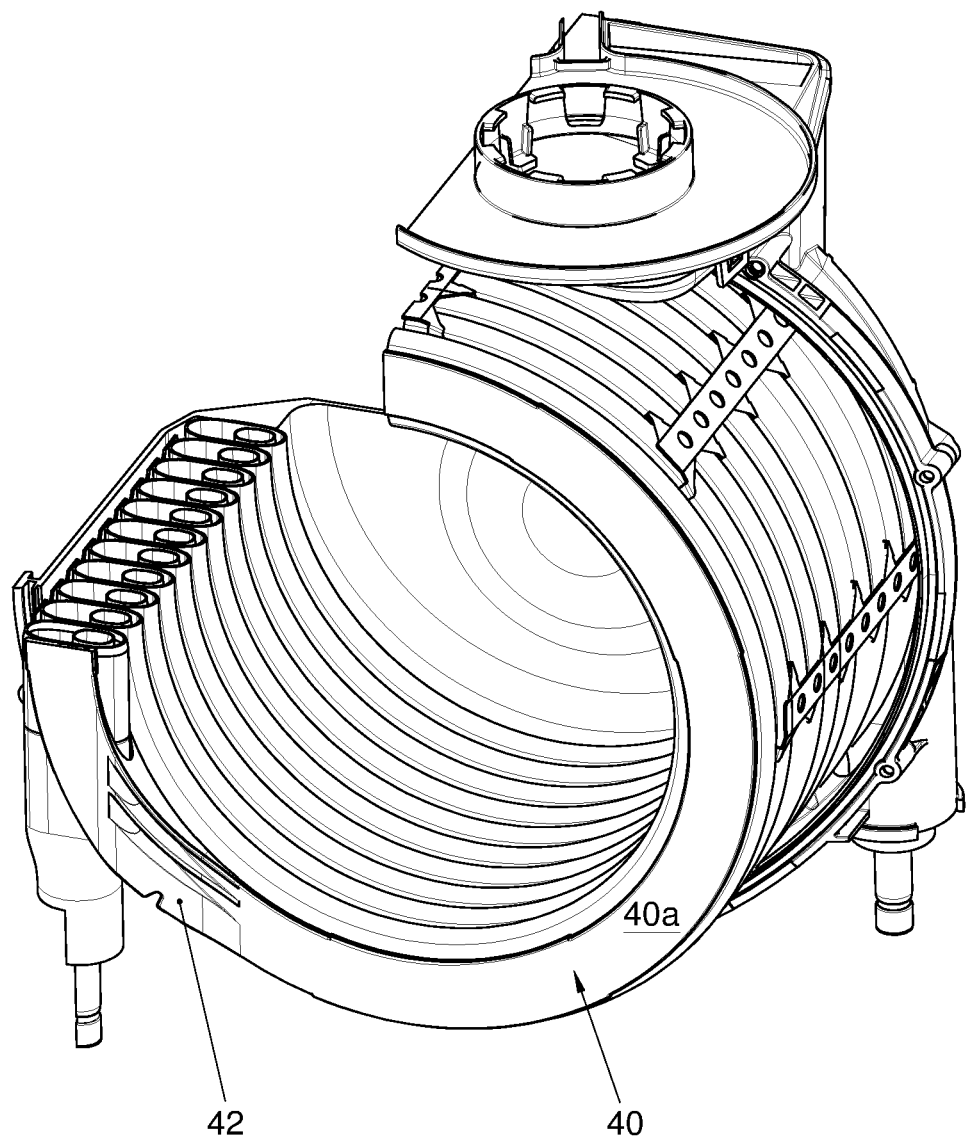
FIG. 7 shows the perspective view of FIG. 5 after placement of the levelling ring.
Figure 8:
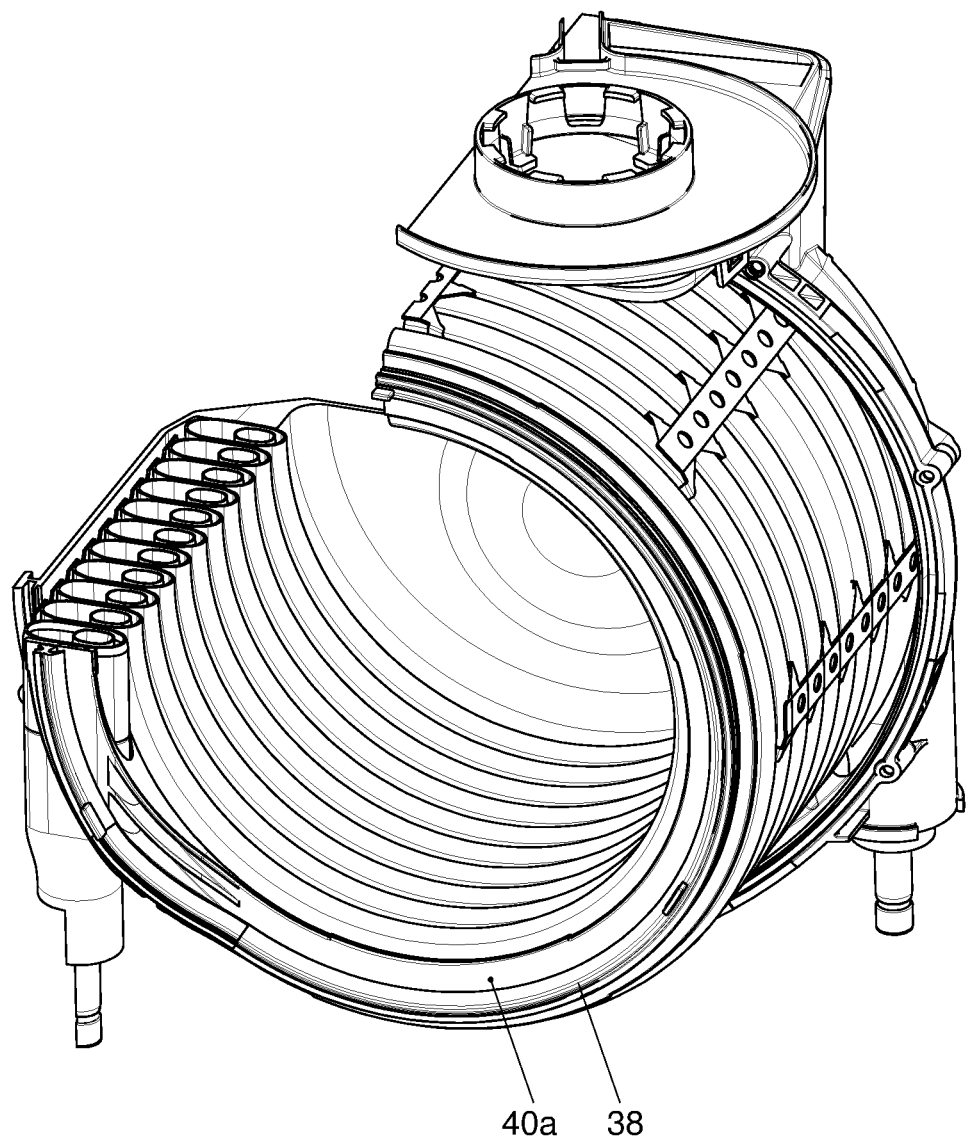
FIG. 8 shows the perspective view of FIG. 7 after placement of a cover seal on the levelling ring.

In an embodiment, of which an example is shown in the figures and is visible in FIGS. 1 and 2, the heat exchanger assembly 10 may comprise a partition plate 48 which extends parallel to the first 26 and the second 36 end wall and which separates the inner space that is bounded by the heat exchanger pipe assembly 12 into the burner chamber part 18 and a flue gas discharge part 50. The burner chamber part 18 of the inner space extends between the burner cover 30 and an upstream side of the partition plate 48. The flue gas discharge part 50 of the inner space extends from a downstream side of the partition plate 48 in the direction of the second end wall 36. In use, flue gases produced by the burner 34 flow via the burner chamber part 18 between the coil windings 12' located on the upstream side of the partition plate 48, into the flue gas transport gap 24. Thereupon, the flue gases flow between the coil windings 12' that are located on the downstream side of the partition plate 48 and thereby leave the flue gas transport gap and end up in the flue gas discharge part 50, then to leave the housing 20, 21 via the exhaust 28 for flue gases.

With such a construction a two-stage heat transfer of the heat of the flue gases to the medium in the heat exchanger pipe assembly 12 is obtained. What can thus be accomplished is that in the second stage a further-reaching condensation of the water vapor present in the flue gases is effected, leading to a heat exchanger with a particularly high efficiency.

In an embodiment, the housing 20, 21 may be divided into the first 20 and the second 21 housing part by a separating plane extending obliquely to the central axis L. Then the first housing part 20, in addition to the first end wall 26, further includes a part of the circumferential wall 22. The circumferential wall 22 of the first housing part 20 has a low side and a high side. In the low side of the first housing part 20 there is a first pipe assembly lead-through 54. Then the second housing part 21, in addition to the second end wall 36, further includes a part of the circumferential wall 22. The circumferential wall 22 of the second housing part 21 likewise has a low side and a high side. In the low side of the second housing part 21 there is a second pipe assembly lead-through 56.

Due to the pipe assembly lead-throughs 54, 56 being situated in the low side of the circumferential wall 22 of the respective housing parts 20, 21, the heat exchanger pipe assembly 12 can be placed in the first housing part 20 in a simple manner and thereupon the second housing part 21 can be placed over the heat exchanger pipe assembly 12 in a simple manner for connection with the first housing part 20. Thereupon the two housing parts can be connected to each other with, for example, screws or bolts 58 (see FIG. 2) which extend in axial direction of the heat exchanger assembly 10. When under the influence of the internal fluid pressure in the heat exchanger pipe assembly 12 the heat exchanger pipe assembly 12 tends to expand in axial direction, the screws or bolts 58 which also extend in axial direction are under strain of tension, which is favorable on constructional grounds.

In an embodiment, the coil shaped heat exchanger pipe assembly 12 can comprise an outer tube 12*a* and an inner tube 12*b* (see FIGS. 9 and 10). The outer tube 12*a* can then be a first medium carrying duct and the inner tube 12*b* can be a second medium carrying duct. In an embodiment, the outer tube 12*a* can be, for example, a central heating water carrying duct and the inner tube 12*b* can be a sanitary water carrying duct.

The invention is not limited in any way to the above-described embodiments nor to the example shown in the figures. It is possible, for instance, that the heat exchanger pipe assembly 12 comprises a number of sub-heat exchanger pipe assemblies placed in line in axial direction, each having their own inlet and outlet. Further, it is possible that more than one partition plate is set up in the inner space bounded by the heat exchanger assembly 12, to form a multi-stage heat exchanger where the flue gas passes the inner space and the circumferential gap more than once.

The various embodiments which have been described above can be applied independently of each other and be combined with each other in different ways. The reference numerals in the detailed description and the claims do not limit the description of the embodiments and the claims and serve for clarification only.

The invention claimed is:

1. A heat exchanger assembly comprising:
    at least one coil shaped heat exchanger pipe assembly for passing through a fluid to be heated, wherein the heat exchanger pipe assembly has an inlet and an outlet and wherein the heat exchanger pipe assembly comprises coil windings which extend concentrically around a coil axis, wherein the heat exchanger pipe assembly on a radial inner side bounds an inner space which comprises a burner chamber part;
    a housing in which the heat exchanger pipe assembly is received, wherein the housing comprises:
        a circumferential wall which is cylindrical and which defines a housing axis which coincides with the coil axis, wherein an inner diameter of the circumferential wall is greater than an outer diameter of the heat exchanger pipe assembly, such that a flue gas transport gap extends between the heat exchanger pipe assembly and the circumferential wall;
        a first end wall which closes off a first end of the circumferential wall; and
        an exhaust for flue gases;
    wherein the heat exchanger assembly further comprises:
    a burner cover which is detachably connected with the housing and which comprises an air/fuel mixture connection;
    a burner which is connected with the burner cover and which extends concentrically around a burner axis which coincides with the housing axis and the coil axis, wherein the burner is situated in the burner chamber part, and wherein the burner is in fluid communication with the air/fuel mixture connection;

wherein, in use, flue gases produced by the burner flow via the burner chamber part between said coil windings into the flue gas transport gap and wherein the flue gases eventually leave the housing via the exhaust;

wherein:

the housing is divided in a first and a second housing part which are both made from plastic, wherein the first housing part includes the first end wall;

the second housing part includes a second end wall, which second end wall closes off a second end of the circumferential wall at least partially and comprises a central burner cover opening which is closed off with the burner cover;

the circumferential wall is formed by one of the first housing part, the second housing part, and the first housing part and the second housing part in combination;

the heat exchanger pipe assembly is clamped in axial direction between the first and the second plastic end wall of the housing;

wherein axial expansion forces exerted by the coil shaped heat exchanger pipe assembly, which occur in use as a result of an internal fluid pressure, are absorbed by the plastic first and second end walls of the housing, and wherein the coil shaped heat exchanger pipe assembly has a first axial end and a second axial end which is opposite the first axial end, the first end wall is at the first axial end, the second end wall is at the second axial end, and the coil shaped heat exchanger pipe assembly is positioned between the first end wall and the second wall and is axially contained by the first end wall and the second end wall.

2. The heat exchanger assembly according to claim 1, wherein the burner cover opening has a diameter that is greater than an inner diameter of the heat exchanger pipe assembly, wherein a radial outer area of the burner cover is in heat exchanging contact with the heat exchanger pipe assembly, such that in use the radial outer area of the burner cover is cooled by the heat exchanger pipe assembly.

3. The heat exchanger assembly according to claim 2, wherein a cover seal is confined between the cooled radial outer area of the burner cover and a part of the second, plastic end wall that bounds the central burner cover opening.

4. The heat exchanger assembly according to claim 1, comprising:

a levelling ring having a rising surface, wherein the levelling ring is situated between a coil winding that extends closest to burner cover and the burner cover, wherein a side of the levelling ring facing the burner cover forms a first contact face which abuts in heat conducting contact against the burner cover, wherein a side of the levelling ring facing the heat exchanger pipe assembly forms a second contact face which abuts in heat conducting contact against the coil winding that extends closest to the burner cover, and wherein the levelling ring is made from heat conducting material.

5. The heat exchanger assembly according to claim 4, wherein a cover seal is confined between the cooled radial outer area of the burner cover and a part of the second, plastic end wall that bounds the central burner cover opening and wherein the cover seal is located on the side of the levelling ring that faces away from the heat exchanger pipe assembly.

6. The heat exchanger assembly according to claim 4, wherein the burner cover, at the location of the area where the levelling ring abuts against the burner cover, is provided with a relief whose shape corresponds to the shape of the levelling ring that comprises the rising surface.

7. The heat exchanger assembly according to claim 3, wherein the cover seal is clamped between a cylindrical wall part of the second end wall which extends parallel to the central axis direction and a cylindrical wall part of the burner cover which extends parallel to the central axis, such that a relative displacement of the burner cover with respect to the housing in the direction of the central axis has no influence on the sealing action of the cover seal.

8. The heat exchanger assembly according to claim 1, comprising:

a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;

wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

9. The heat exchanger assembly according to claim 1, wherein the housing is divided into the first and the second housing part by a separating plane extending obliquely to the central axis, wherein the first housing part, in addition to the first end wall, further includes a part of the circumferential wall, wherein the circumferential wall of the first housing part has a low side and a high side, wherein a first pipe assembly lead-through is situated in the low side of the first housing part, wherein the second housing part, in addition to the second end wall, further includes a part of the circumferential wall, wherein the circumferential wall of the second housing part has a low side and a high side, wherein a second pipe assembly lead-through is situated in the low side of the second housing part.

10. The heat exchanger assembly according to claim 1, wherein the coil shaped heat exchanger pipe assembly comprises an outer tube and an inner tube, wherein the outer tube is a first medium carrying duct and wherein the inner tube is a second medium carrying duct.

11. The heat exchanger assembly according to claim 10, wherein the outer tube is a central heating water carrying duct and wherein the inner tube is a sanitary water carrying duct.

12. The heat exchanger assembly according to claim 2, comprising:

a levelling ring having a rising surface, wherein the levelling ring is situated between a coil winding that extends closest to burner cover and the burner cover, wherein a side of the levelling ring facing the burner cover forms a first contact face which abuts in heat conducting contact against the burner cover, wherein a side of the levelling ring facing the heat exchanger pipe assembly forms a second contact face which abuts in heat conducting contact against the coil winding that extends closest to the burner cover, and wherein the levelling ring is made from heat conducting material.

13. The heat exchanger assembly according to claim 3, comprising:
a levelling ring having a rising surface, wherein the levelling ring is situated between a coil winding that extends closest to burner cover and the burner cover, wherein a side of the levelling ring facing the burner cover forms a first contact face which abuts in heat conducting contact against the burner cover, wherein a side of the levelling ring facing the heat exchanger pipe assembly forms a second contact face which abuts in heat conducting contact against the coil winding that extends closest to the burner cover, and wherein the levelling ring is made from heat conducting material.

14. The heat exchanger assembly according to claim 5, wherein the burner cover, at the location of the area where the levelling ring abuts against the burner cover, is provided with a relief whose shape corresponds to the shape of the levelling ring that comprises the rising surface.

15. The heat exchanger assembly according to claim 2, comprising:
a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;
wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

16. The heat exchanger assembly according to claim 3, comprising:
a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;
wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

17. The heat exchanger assembly according to claim 4, comprising:
a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;
wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

18. The heat exchanger assembly according to claim 5, comprising:
a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;
wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

19. The heat exchanger assembly according to claim 6, comprising:
a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;
wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

20. The heat exchanger assembly according to claim 7, comprising:
a partition plate which extends parallel to the first and the second end wall and which separates the inner space which is bounded by the heat exchanger pipe assembly into the burner chamber part and a flue gas discharge part, wherein the burner chamber part of the inner space extends between the burner cover and an upstream side of the partition plate, and wherein the flue gas discharge part of the inner space extends from a downstream side of the partition plate in the direction of the second end wall;

wherein, in use, flue gases produced by the burner flow via the burner chamber part between said coil windings that are situated on the upstream side of the partition plate into the flue gas transport gap and wherein the flue gases thereupon flow between said coil windings that are situated on the downstream side of the partition plate and thereby leave the flue gas transport gap and end up in the flue gas discharge part to then leave the housing via the exhaust for flue gases.

\* \* \* \* \*